United States Patent [19]
Davis et al.

[11] 4,368,943
[45] Jan. 18, 1983

[54] AUXILIARY EQUIPMENT ENCLOSURE UNIT FOR WATTHOUR METER SOCKETS

[75] Inventors: Steven B. Davis, St. Mathews Township, Wake County, N.C.; Forrest E. Coyle, Penn Hills; Denis E. Bedel, Ross Township, Allegeheny County, both of Pa.

[73] Assignee: Westinghouse Electric Corp., Pittsburgh, Pa.

[21] Appl. No.: 128,221

[22] Filed: Mar. 7, 1980

[51] Int. Cl.³ .................................................. H01R 13/20
[52] U.S. Cl. .................................................. 339/198 M
[58] Field of Search ................ 339/193 P, 198 M; 361/367, 372, 373, 415

[56] References Cited
U.S. PATENT DOCUMENTS

| | | | |
|---|---|---|---|
| 2,218,650 | 10/1940 | Larson | 339/198 M |
| 2,606,232 | 8/1952 | St. John | 175/223 |
| 3,067,362 | 12/1962 | Patton | 317/104 |
| 3,167,690 | 1/1965 | Wallman | 317/108 |
| 3,221,216 | 11/1965 | Kobryner | 361/373 X |
| 3,334,276 | 8/1967 | Bateman et al. | 317/108 |
| 3,549,951 | 12/1970 | Plummer | 361/372 |
| 3,596,139 | 7/1971 | Walsh | 361/415 X |
| 3,643,209 | 2/1972 | Coston | 339/155 R |
| 3,714,516 | 1/1973 | Howe | 317/104 |
| 4,121,147 | 10/1978 | Becker et al. | 324/104 |

*Primary Examiner*—Joseph H. McGlynn
*Attorney, Agent, or Firm*—Robert E. Converse, Jr.

[57] ABSTRACT

A detachable enclosure unit for use at standard watthour meter sockets includes a central housing for carrying auxiliary equipment and an integral mounting extension with a snap-on retainer for adaptive mounting to both ring and ringless sockets. The retainer provides a removable circumferentially disposed flange surface equally accommodating the different types of meter sockets.

27 Claims, 13 Drawing Figures

AUXILIARY EQUIPMENT ENCLOSURE UNIT FOR WATTHOUR METER SOCKETS

CROSS REFERENCE TO RELATED APPLICATIONS

This application is related to U.S. patent application Ser. No. 128,222, for "An Auxiliary Equipment Enclosure Unit For Watthour Meter Sockets" filed concurrently with this application and assigned to the same assignee.

BACKGROUND OF THE INVENTION

The present invention relates to an improved auxiliary equipment enclosure unit for detachable mounting at either ring or ringless types of watthour meter sockets.

Equipment enclosure units having an interposed mounting between a detachable watthour meter and a standard watthour meter socket are known for installation of auxiliary equipment at an existing electric energy metering installation. The standard meter sockets include two conventional types referred to as the ring and ringless types. The detachable meter sockets generally include an enclosure, which sometimes takes the form of a meter box, and female or jaw type terminals for receiving blade or bayonet type terminals extending from watthour meters having standard detachable mounting arrangements. When installing a detachable meter at a ring type socket, a conventional sealing ring having a split circular configuration and a U-shaped cross section is used. The sealing ring holds the periphery of a standard meter base arrangement used in detachable watthour meters, against an outer extending radial mounting rim of the ring type socket. The ends of the sealing ring are locked in a contracted position for clamping the watthour meter on the ring socket, as is well known. When installing a detachable meter at a ringless type socket which includes a box enclosure, a front cover of the enclosure is opened so that a circular opening thereof can receive the front of the meter. When the cover is closed, the edges of the cover opening prevent the meter from being removed from the meter socket enclosure. The above detachable meter mounting arrangements are often desired to accommodate mounting of an auxiliary equipment enclosure unit as well as detachable watthour meters at either type of meter socket.

When auxiliary or supplementary metering and distribution line control equipment or circuits are to be removably installed at standard detachable watthour meter sockets, the associated enclosure units are desired to have a number of characteristics. The enclosure units are to carry and protect different auxiliary equipment or circuits which may be larger than the diameter of a detachable meter; be capable of having the rear end thereof easily and simply attached to either of the two types of ring and ringless meter sockets; be capable of having a detachable watthour meter attached at a front end, thereof, if desired; be capable of maintaining the standard metering connections between the meter and the socket terminals when a detachable meter is mounted thereto; be made in a simple and low cost manner; and be useable without alteration or modification of the detachable mounting arrangements of either the meter socket or the meter.

In U.S. Pat. No. 4,121,147 an auxiliary housing has an open front which carries a standard watthour meter and further includes auxiliary jaw terminals receiving the meter blade terminals. The rear of the auxiliary housing has an outer circular rim substantially the same diameter as the rear mounting flange of the base of a standard watthour meter. Auxiliary blade terminals are provided at the housing rear for insertion into meter socket terminals. An auxiliary housing or enclosure of the aforementioned type is satisfactory and can be installed at either type of meter socket so long as the outer periphery of the auxiliary housing does not extend radially beyond the rear mounting rim thereof. Often the housing size cannot be so limited and still be satisfactory for carrying larger types of auxiliary equipment. In U.S. Pat. No. 3,714,516 a large auxiliary equipment housing is disclosed for mounting between a detachable watthour meter and either of the ring or ringless types of meter sockets. A separate mounting adapter fastens to the rear of the housing and has two separate diametrically disposed locking members which must be installed with screws. Each locking member has two axially spaced and radially extending fingers to form two diametrical sets of radially extending fingers. The different sets of coplanar fingers provide two relatively small radial extensions for clamping the housing to either the ring or ringless types of meter sockets. An additional set of resiliently biased blade to jaw terminal connections or joints are required in the housing.

Further examples of prior art auxiliary equipment enclosure units are disclosed in U.S. Pat. Nos. 2,606,232; 3,067,362; 3,167,690; 3,334,276; 3,549,951; and 3,643,209 for use with watthour meters and with one but not both types of meter sockets and wherein the enclosure unit has a larger size than the diameter of the meter.

SUMMARY OF THE INVENTION

In accordance with the present invention an auxiliary equipment enclosure unit is made for ease of detachable mounting at either of standard ring and ringless types of meter sockets. The enclosure unit includes a box-like housing having the interior arranged for carrying, in a protective relationship, auxiliary metering and distribution power line control equipment which can be provided on circuit boards in one preferred embodiment. Such equipment and circuits are typically included in communications terminals, remote load control and remote meter reading circuits and devices used in power line carrier communication systems. The front end of the enclosure preferably includes a meter attachment assembly for receiving a standard mounting arrangement of a detachable watthour meter. The rear end of the enclosure includes an adaptive socket attachment assembly having a mounting extension that extends in a reduced area from the rear of the housing so as to be adapted for insertion through the meter opening of an enclosure cover of a ringless meter socket or so that the back of the extension fits against the radial mounting rim of a ring type meter socket. A recessed portion formed by a groove in the outer periphery of the mounting extension receives and holds in place a separate and removable radially extending retainer member. The retainer member is assembled to the mounting extension in a snap-on fashion to provide a circumferential flange surface radially outward of the periphery of the extension for restraining removal through a meter cover opening of a ringless socket or from an overlapping sealing ring when mounted to a ring type meter socket. In a preferred form the retainer member includes a releasable fastener assembly having mutually interlocking parts formed on the retainer member and on the mounting extension.

The enclosure unit further includes separate blade terminal extensions which are fixedly attached in a rigidly clamped relationship to the blade terminals of a detachable meter. The terminal extensions extend from the meter, through the housing, and are supported at the back of the mounting extension so as to extend from the enclosure unit to mate with the jaw terminals of a meter socket having a standard detachable meter mounting arrangement.

It is a general feature of the present invention to provide an auxiliary equipment enclosure unit that is mountable at meter sockets having standard detachable watthour meter mounting arrangements of either the ring or ringless types by including a simple adaptive socket attachment assembly not requiring different adjustments for use with the different types of meter sockets and not limiting the size of enclosure housing for receiving equipment therein. Another feature of the present invention is to provide an integral mounting extension at the rear end of the enclosure unit that receives, in a resilient snap-on fashion, a separate and removable retainer member extending in a substantially circularly arcuate length radially outward from the mounting extension so that a preferred form of the retainer member provides a rim surface generally corresponding to the outer peripheral mounting surface of a cover rim at the base of a detachable watthour meter for complementary mounting at either the ring or ringless types of meter sockets. A still further feature of this invention is to provide an auxiliary equipment enclosure unit for axially interposed mounting between a watthour meter and a meter socket both having standard detachable meter mounting arrangements wherein separately mountable blade terminal extensions thereof are connected in rigidly clamped relationship to the meter blade terminals to reduce contact resistance heating therebetween. A still further feature of this invention is to provide an auxiliary equipment unit formed by two molded parts which when assembled together define housing and end attachment portions which are separable to provide easy mounting of equipment devices within the housing and wherein in a preferred embodiment a plurality of circuit board cards are mounted for carrying circuit components of a communications terminal or remote power line control or meter reading systems for compact installation and weather protected mounting at detachable watthour meter sockets typically found at electric energy metering installations.

These and other features and advantages of the present invention will be apparent from the detailed description of the preferred embodiments of the invention as shown in the accompanying drawings briefly described hereinafter.

DESCRIPTION OF THE PREFERRED EMBODIMENTS

Figure 1:
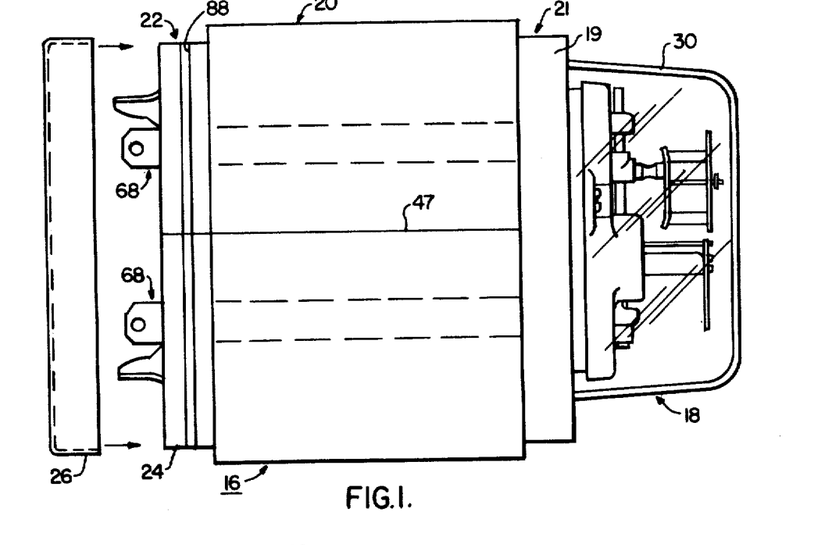
FIG. 1 is a side elevation view of an auxiliary equipment enclosure unit made in the accordance with the present invention and attached to a detachable watthour meter with a removable retainer member thereof being shown separate.

Referring now to the drawings and more particularly to FIG. 1 there is shown an auxiliary equipment enclosure unit 16 made in accordance with the present invention and attached to a detachable watthour meter 18 by means of a conventional sealing ring 19. The body of the enclosure unit 16 includes a box-like equipment housing 20. At the front end of the housing 20 a meter attachment assembly 21 of the unit 16 receives the sealing ring 19 for mounting the meter 18. An adaptive socket attachment assembly 22 is provided at the rear end of the unit 16 adjacent the housing 20 and forms an important feature of the present invention. A mounting extension 24 extending integrally rearward from the housing 20 and a removable retainer member 26, shown separated from the unit 16, are included in the socket attachment assembly 22 as described more fully hereinbelow.

Before describing the present invention in further detail, it is noted that the enclosure unit 16 is generally intended for use with detachable watthour meters, such as meter 18, having a standard detachable mounting arrangement and standard meter sockets having either of the ring or ringless types of standard detachable meter mountings. Standards for such detachable watthour meters and watthour meter sockets are published by the American National Standards Institute, (ANSI) Inc., 1430 Broadway, New York, N.Y. 10018. Dimensional standards and configurations for detachable watthour meter mountings are set forth in ANSI standards C12.10 and are set forth for detachable meter mounting sockets in ANSI standards C12.7. Similar standards have been published by the National Electrical Manufacturers Association (NEMA) and the Edison Electrical Institute (EEI). These standards permit detachable meters, such as meter 18, to be made by different manufacturers so as to mate with the standard meter sockets also made by different manufacturers. Watthour or electric energy metering installations typically include the detachable meters mounted in the meter sockets having the detachable meter mounting arrangements at an electrical utility customer's location. The electric utility company's power line service usually is interconnected with the customer's local electrical system at a meter socket often mounted outside. Thus, such metering installations provide an accessible location for a power line communications terminal for which the enclosure unit 16 is intended for use in one preferred embodiment. Such communications terminals are effective to provide remote customer load control and remote watthour meter readings via carrier signals transmitted through an electric utility distribution system to the utility customer's premises. Alternatively, the enclosure unit 16 can carry various devices for power line control or monitoring at a power line location connected to a meter socket not intended to receive a meter so that the meter 18 would not be attached to the front of the enclosure unit.

One example of a meter having the standard detachable mounting arrangement as included in the detachable watthour meter 18 is disclosed in U.S. Pat. No. 3,309,152, assigned to the assignee of this invention. The meter disclosed in the aforementioned patent is a single phase type typically installed at an electric energy metering installation of a residential electric utility customer. The meter 18 is typically equipped with either an electronic pulse initiator device or a meter dial encoding device as disclosed in U.S. Pat. Nos. 4,034,292 and 4,037,219, respectively, both assigned to the assignee of this invention. With meters of the above types, the enclosure unit 16 typically carries remote meter reading, remote load control and associated communications terminal equipment. For purposes of explanation and not limitation the detachable mounting arrangement of the watthour meter 18 is briefly described hereinafter, it being understood that other watthour meters such as those having a fifth terminal or those of the polyphase or demand meter type may replace the meter 18. The enclosure of the watthour meter 18 includes a cup shaped transparent cover 30, partially shown in FIG. 5, which is detachably mounted on a meter base 32 by means of a cover locking rim 34. One example of a watthour meter enclosure is disclosed U.S. Pat. No. 3,846,677, assigned to the assignee of this invention, wherein four conventional male or blade terminals 36 are described extending from the rear of the meter base 32. The blade terminals 36 are provided in accordance with the specifications for standard terminal arrangements as set forth in the standard publications noted hereinabove. Four feet projections 38 are formed integral with the meter base 32 adjacent the blades 36 for protecting the blade terminals 36 and for aiding mounting of the meter 18.

Figure 5:
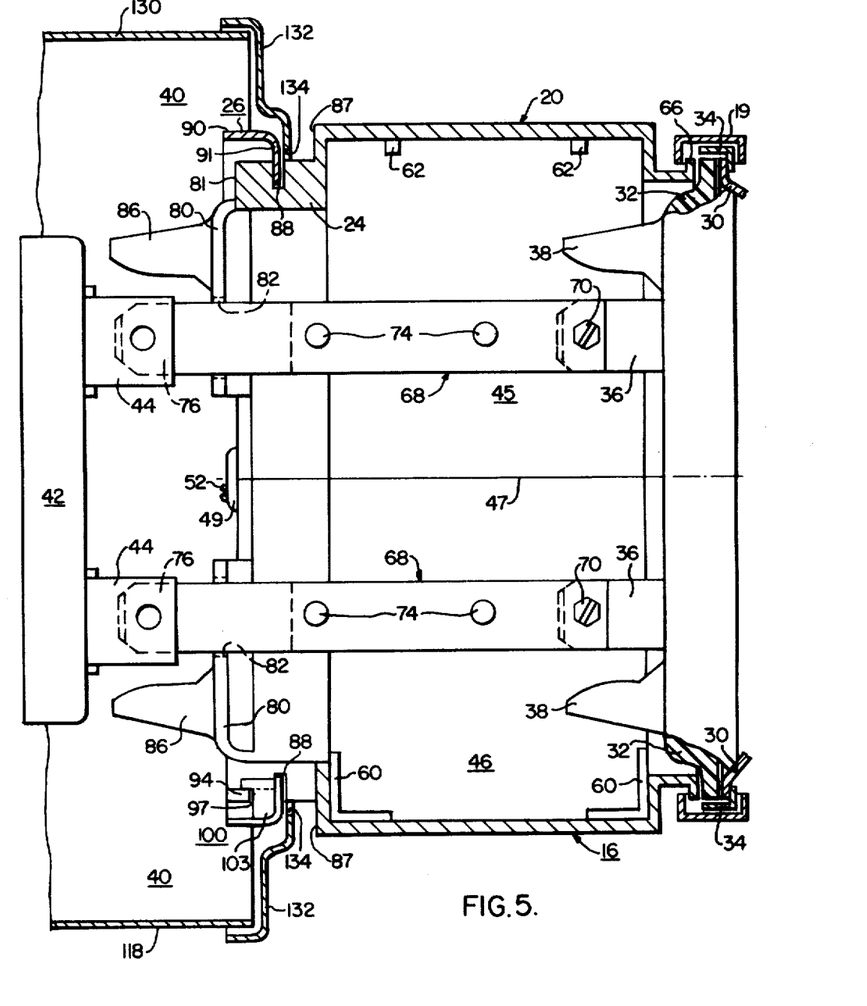
FIG. 5 is a side cross sectional view of the enclosure unit illustrating the manner of mounting the unit between a ringless meter socket, partially shown, and a detachable watthour meter, partially shown.
Figure 11:
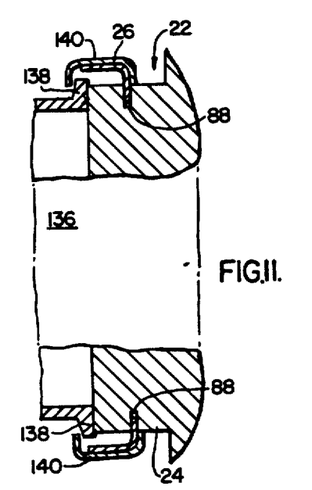
FIG. 11 is a fragmentary cross sectional view with parts removed showing the manner of installing the rear of the enclosure unit to a ring type and meter socket.

Examples of standard ring and ringless types of meter sockets are described in the aforementioned standards publications and are shown in the prior U.S. Patents listed above in the beginning of this specification. A side cross sectional view of a ringless type meter socket 40 is shown in FIG. 5 and the fragmentary view of FIG. 11 shows a ring type meter socket for illustrating the different modes of mounting the enclosure unit 16 by means of the adaptive socket attachment assembly 22. Each of the meter socket types includes a terminal block such as the terminal block 42 shown in FIG. 5 carrying a standard socket terminal arrangement including female or jaw terminals 44. The jaw terminals 44 are provided to directly receive and resiliently contact the meter blades 36. Utility power line conductors and the customer wiring conductors are connected to the jaw terminals 44 at connections are shown, as is also well known.

In FIG. 5 the detail arrangement of the enclosure unit 16 is shown and it is initially noted that in one preferred embodiment the enclosure unit 16 is intended to carry auxiliary equipment, by way of example and not limitation, formed by a remote power line communications terminal referred to as a load management terminal (LMT) system such as described and claimed in U.S. Pat. No. 4,130,874, assigned to the assignee of this invention. The communications, remote load control and remote meter reading circuits of the LMT system are mounted within the enclosure unit 16 as described further hereinbelow. The present invention is not intended to be limited to any specific function of the auxiliary equipment to be carried by the equipment enclosure unit 16.

The body of the equipment enclosure unit 16 comprises two (an upper half and lower half) body parts 45 and 46 preferably made of a molded plastic such as a thermosetting glass filled polyester material having high impact strength, light weight, high electrical insulating and dielectric strength characteristics as well as providing relatively low manufacturing costs and good resistance to weather. Other suitable materials are contemplated for use in making the present invention including fabrication from sheet metal materials. The upper and lower half body parts 45 and 46 have a thin wall construction and are fitted together along a center horizontal plane thereof indicated by the reference line 47 in FIGS. 2 and 3. A pair of rear tabs 49 and a pair of front tabs 50 extend downward from the upper body part 45 to overlap the lower body part 46. Threaded fasteners 52 such as self-tapping screws are mounted in mutually aligned holes at the tab overlapping areas of the parts to fixedly secure the two parts together. Thus assembled, the upper and lower body parts 45 and 46 are complementary and symmetrically arranged for forming the various portions described hereinafter.

The housing 20 includes a hollow cavity with a generally box-like shape. The slightly convexly tapered housing sides define substantially equal longest outside height and width dimensions in the order of seven and one-eighth inch (18.1 cm), being larger than the outermost diameter of the detachable meter 18. The axial length of the housing 20 is in the order of 4.9 inches (9.9 cm). The interior of the housing 20 is adapted, in a preferred embodiment, to carry four circuit boards or cards 54, 55, 56, and 57 which carry electronic circuit components of the aforementioned LMT system. The interior of the lower body part 46 includes four slotted card mounting members or guides 60 receiving the bottom corners of the circuit board cards 54, 55, 56, and 57. The interior of the upper body part 45 is shown with four V-notched card mounting members formed by guides 62 vertically aligned with the guides 60 so as to receive the tops of the circuit board cards. Thus, the guides 60 and 62 carry the circuit board cards in parallel vertical orientations. The cards 54, 55, 56, and 57 are normally mounted in the lower guides 60 of part 46 prior to the upper body part 45 being assembled to the lower part 46. The notched surfaces of the guides 62 effectively cam the tops of the cards into the center of the guide 62 as the upper part 45 is mounted to the lower part 46 and secured thereto to form the integral body of the enclosure unit 16. Different numbers of the card mounting arrangements may be provided for a different number of circuit board cards to be carried.

Figure 2:
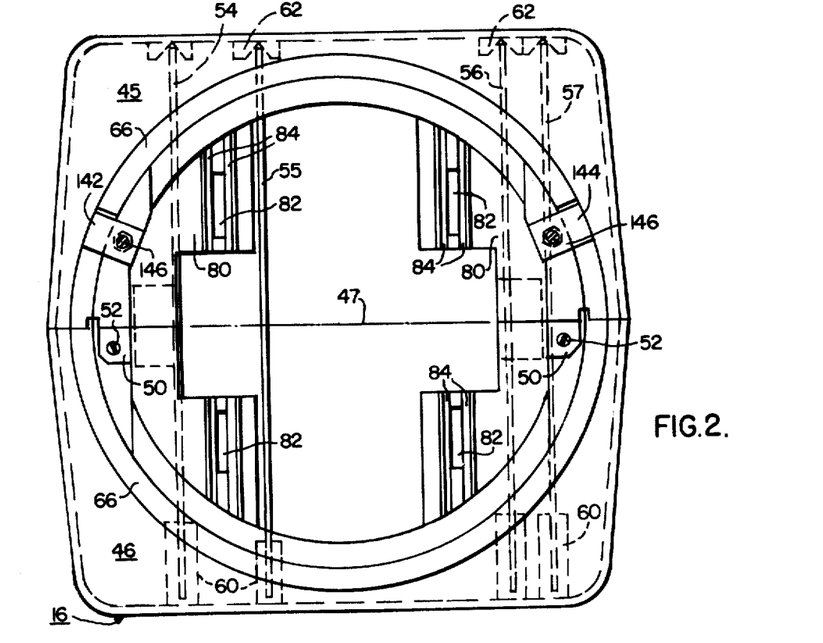
FIG. 2 is a front elevational view of the enclosure unit shown in FIG. 1 with parts removed.

Referring now to the front end of the enclosure unit 16 as shown in FIGS. 5 and 2, the aforementioned meter attachment assembly 21 includes a circular mounting rim 66 extending integrally from the front vertical wall of the housing 20 and the rim has a radial flange configuration. The rim 66 has a diameter which is less than the height and width dimensions of the housing 20 and the rim dimension is within those specified for the detachable meter mounting rims of a standard ring type meter socket. With the detachable watthour meter 18 assembled to the front end of the enclosure 16 and against the forward radial surface of the rim 66, the standard sealing ring 19 couples the detachable mounting arrangement of the enclosure of the meter 18 and the enclosure unit 16 together in a sealed relationship, as shown. The sealing ring 19 has the standard U-shaped cross section radially overlapping the base 32 of the meter enclosure around the outer periphery of the cover locking rim 34 and the back of the rim 66, as shown in FIG. 5. One suitable sealing ring for use as the sealing ring 19 is disclosed in U.S. Pat. No. 4,149,741, assigned to the assignee of this invention.

Figure 12:
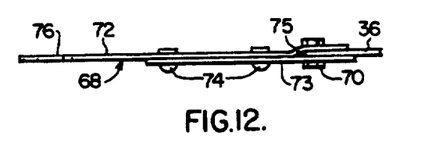
FIG. 12 is a side elevational view of one terminal blade extension made in accordance with the present invention and included in the enclosure unit shown in FIGS. 1 and 5.
Figure 13:
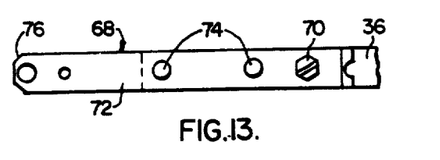
FIG. 13 is a top elevational view of the terminal blade extension shown in FIG. 12.

Prior to the detachable mounting of the watthour meter 18 to the enclosure unit 16, four identical blade terminal extensions 68 are attached by removable rigid clamping members including four threaded fasteners 70, formed by machine screws and nuts, to the four meter blade terminals 36. One of the terminal extensions 68 is shown in FIGS. 12 and 13 as it is formed of a copper rectangular bar conductive material the same or similar to the material forming the blades 36. Each terminal extension 68 includes long and short overlapping parts 72 and 73. The parts 72 and 73 are preferably riveted together by rivets 74 or can be welded together. The blade extension parts have substantially the same width and thickness as the bar material of the meter blades 36. The forward end of the part 72 is offset to form a bifurcated forward end having a slot 75 with straight sides for receiving one of the blades 36, as shown in FIG. 12. The flat inner sides of the parts 72 and 73 are rigidly clamped in a fixed relationship with substantial compressive pressure to both flat sides of each of the meter blades 36 by each of the rigid fasteners 70 to provide an expanded and positive electrical contact area therebetween. Electrical resistance and resulting heating is substantially reduced by the use the blade terminal extensions 68 as compared to that produced by the resilient contact engagement provided between auxiliary or additional blade to jaw terminal connections provided in many of the aforementioned prior art auxiliary equipment enclosure units. Thus, the terminal blade extensions 68 of the enclosure unit 16 are capable of conducting rated meter current values, for example two hundred amperes for the detachable watthour meter 18, without excessive heat being generated in the housing 20 due to the connections between the extensions 68 and meter blade terminals 36.

The rear jaw contacting ends 76 of each of the terminal blade extensions 68 are identical and have substantially the same size and configuration as the corresponding jaw contacting ends of the meter blade terminals 36. Accordingly, the predetermined lengths of the terminal extensions 68 provide a length in the blade extension contacting ends 76 as they extend from the rear of the unit 16 which is the same as the length that the meter blade terminals 36 extend from the meter 18. With the enclosure unit 16 mounted between the meter 18 and meter socket 40 as shown in FIG. 5, the rear ends 76 of the terminal extensions 68 mate and extend into electrical contact with the jaw terminals 44 in the same manner as if the meter blade terminals 36 were mounted in the jaw terminals 44 when the meter 18 is mounted directly to the meter socket 40.

Figure 3:
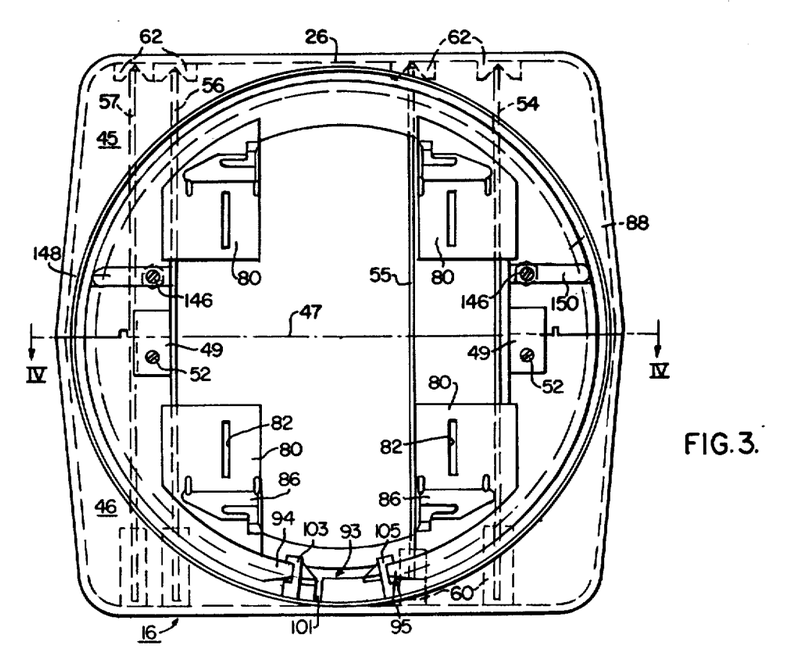
FIG. 3 is a rear elevational view of the enclosure unit shown in FIG. 1 with parts removed.
Figure 4:
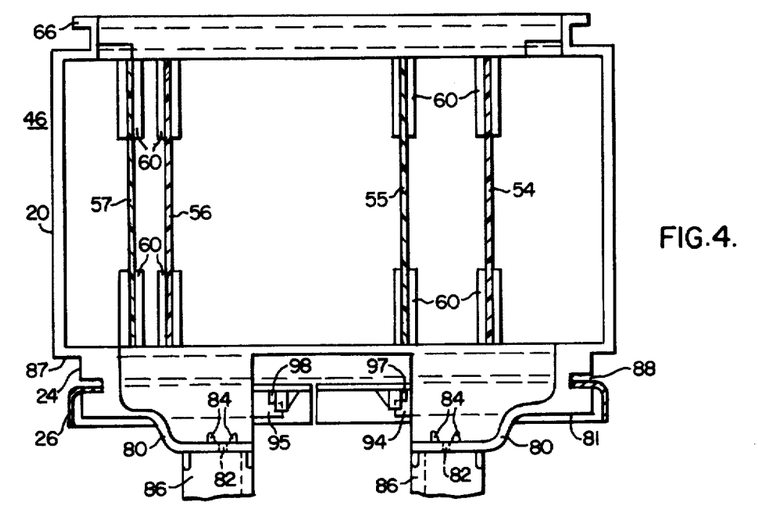
FIG. 4 is a cross sectional view taken along a reference line 47 in FIG. 3 and looking in the direction of the arrows IV—IV.
Figure 10:
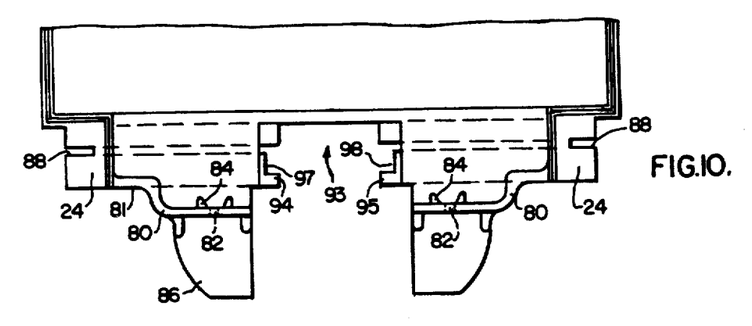
FIG. 10 is a fragmentary bottom sectional view of the enclosure unit shown in FIG. 4.

The rear end of the enclosure unit 16, as shown in FIG. 3, is terminated by four generally identical blade support areas 80 also partially shown in the cross sectional view of FIGS. 4 and 5. The support areas 80 extend rearward from the back side 81 of the mounting extension 24 and each includes a slot opening 82 for receiving in close fitting relationship to the sides thereof one of the blade terminal extensions 68. Blade guides 84 shown in FIG. 10 are provided on the interior side of the blade support areas 80 adjacent the slots 82. The guides 84 have diverging sides to aid in directing the rear ends 76 of the blade terminal extensions 68 through the slots 82 in the back side 81 wall of the enclosure unit 16. The support areas 80 are formed to be substantially identical to the corresponding blade support areas of the watthour meter base 32. Accordingly, each of the support areas 80 includes feet projections 86 which are substantially identical to the corresponding feet projections 38 of the meter base 32. The position of the feet projections 86 relative to each of the slots 82, as shown in FIG. 5, is the same as the positions of the feet projections 38 relative to the meter blade terminals 36.

In one alternative embodiment of the enclosure unit 16, not shown, modified and shortened forms of the extensions 68 are used so that forward portions thereof terminate within the housing 20 adjacent the rear thereof. Cotter pins extending through the partial blade extensions on either side of the enclosure unit wall maintain them in place to extend from the rear of the unit 16. The detachable meter 18 is not mounted on the front end of the unit 16 and the opening thereof is covered by a circular cap having an internally grooved rim for attachment over the rim 66. Thus arranged, the one alternative enclosure unit is detachably mountable at either of the standard meter sockets by the adaptive attachment assembly 22 without a meter.

Figure 6:
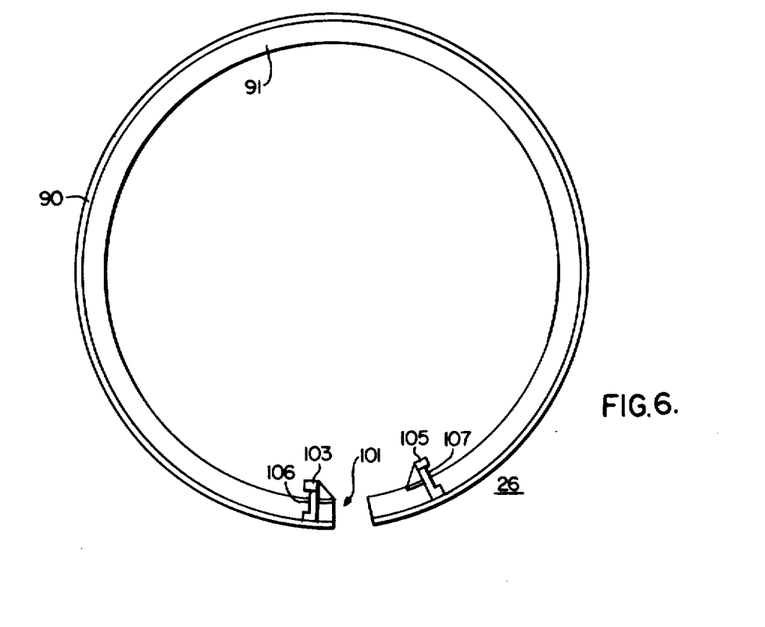
FIG. 6 is a rear elevational view of the retainer member shown in FIG. 1.

Referring now in particular detail to the adaptive socket attachment assembly 22 shown in FIG. 5, the mounting extension 24 of the assembly 22 extends axially and horizontally from the back vertical wall 87 of the housing 20 and terminates at the blade support areas 80. Substantially straight cylindrical sides form the outer periphery of the extension 24 so as to have a diameter that circumscribes an area that is less than that defined by the height and width dimensions of the housing 20 to accommodate the different standard detachable meter mounting arrangements as noted further hereinbelow. The removable retainer member 26 is also included in the adaptive socket attachment assembly 22 and is shown in its assembled position on the extension 24 in FIGS. 2, 3, 4 and 5 and also in FIG. 11. The mounting extension 24 has a continuous recess in the periphery thereof formed by an annular groove 88 shown in FIGS. 4, 5, and 11. The groove 88 has radially inward extending and slightly converging sides terminating at a predetermined depth. The groove 88 is substantially parallel to the housing back wall and is spaced axially therefrom a predetermined distance to provide a gap when the retainer member is in place for receiving a sealing ring or front cover of a socket enclosure. In one preferred form, shown in FIGS. 6 and 7, the retainer member 26 has a resilient split-ring shape with an L-shaped cross section. The L-shape includes an outer horizontal or axially extending rim portion 90 and a radially inward extending portion 91. The circular split-ring configuration of the retainer member 26 as shown in FIG. 6 has an outer diameter in the order of 6.96 inches (17.7 cm) and inner diameter in the order of 6.19 inches (15.7 cm). The inner part of the radial portion 91 is received in the groove 88 by resiliently spreading the ends of the member 26 so that it returns to its normal shape when it enters the groove. The outer diameter rim portion 90 is then spaced radially outward a predetermined distance from the cylindrical periphery of the mounting extension 24. The diameter of the periphery of the extension 24 is in the order of 6.5 inches (16.5 cm). Thus, when the retainer member 26 is assembled in a snap-on manner to the groove 88, the axial portion 90 defines a rim surface and mounting flange having substantially the same diameter as does the meter cover locking rim 34 at the base of the enclosure of the detachable meter 18. Obvious modifications can be made to the retainer member 26 in which it has a flat rather than L-shaped cross section, and/or is made in two C-shaped halves both snapped into the groove 88, and the like.

Figure 7:
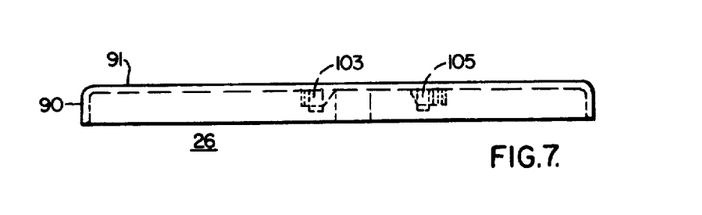
FIG. 7 is a top elevational view of the retainer member shown in FIG. 6.

The mounting extension 24 extends in a substantially continuous cylindrical peripheral surface from a bottom gap opening 93 radially extending into the side thereof and defining spaced ends 94 and 95 shown in FIGS. 3 and 10. Generally radial and facing notch recesses 97 and 98 extend into the inner ends 94 and 95 of the mounting extension 24. The notch surfaces form one part of a releasable fastener assembly 100 partially shown in the lower left hand portion of FIG. 5 for further locking the retainer member 26 to the mounting extension 24. The releasable fastener assembly 100 is more fully understood after further description of the retainer member 26 hereinafter. In FIGS. 6 and 7 the retainer member 26 is shown as it is removed from the enclosure unit 16 and is made in one preferred resilient form of a molded plastic material. The rear elevational view of FIG. 6 illustrates the generally circular split ring configuration of the retainer member 26 having the dimensions noted above. The axial cross section of the retainer member includes the aforementioned axial rim and radial portions 90 and 91, respectively. The ends of the retainer member 26 are spaced by a predetermined gap 101 and carry latching parts 103 and 105 which extend generally radial along the inner surfaces of the axial and radial portions 90 and 91. The parts 103 and 105 have mutually overlapping surfaces defining notch recesses 106 and 107, respectively, forming a second part of the releasable fastener assembly 100. When the retainer member 26 is assembled in the groove 88 of the mounting extension 24 the parts 103 and 105 are assembled in the notch recesses 97 and 98, respectively, the member 26 is slightly contracted and biased inwardly. Thus, mutually interlocking parts form the releasable fastener assembly 100 between the mounting extension ends 94 and 95 and at the retainer member ends having parts 103 and 105. The length of the notch recesses 106 and 107 are substantially straight and only slightly longer than the length of the notch recesses 97 and 98 so that the outer diameter of the retainer member 26 is maintained at a constant circular dimension and is held without substantial movement within the groove recess on the extension 24. The resiliency of the contracted retainer member 26 biases the parts 103 and 105 against the ends 94 and 95 to secure the ends of the member 26 and provide a more stable mounting. The part 105 is spaced relative to the adjacent end of the retainer member 26 so that when the member 26 is mounted in place, gap 101 is minimum as shown in FIG. 3 and the bottom gap opening 93 in the mounting extension 24 is substantially covered. Thus, when the retainer member 26 is mounted by the snap-on operation to the mounting extension 24, a substantially continuous sealed relationship is formed therebetween. The radially outward extending retainer member 26 is positioned around the mounting extension 24 to provide a substantially identical circular mounting flange surface having predetermined circumferentially overlapping relationships with the ring and ringless sockets as formed by the meter cover locking rim 34.

Figure 9:
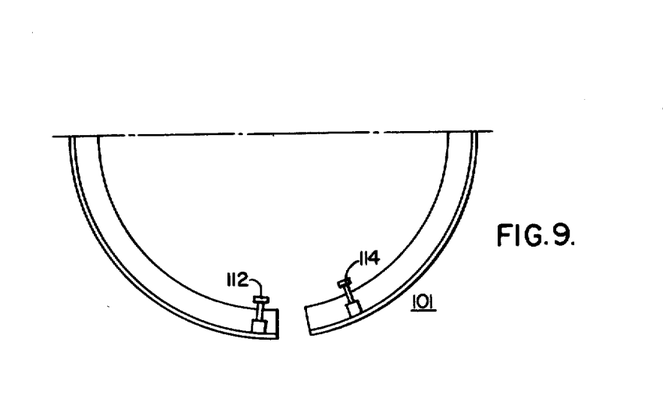
FIG. 9 is a rear elevational view of the alternative retainer member shown in FIG. 4.

A fragmentary view of one alternate retainer member 110 is shown in FIG. 9 as it is made of a sheet metal material formed to have the same size and configuration as described hereinabove for the retainer member 26. Latching parts 112 and 114 are formed by rivets having outer overlapping head portions to generally correspond to the parts 103 and 105 of the retainer member 26. The parts 112 and 114 are arranged to interlock with the notch recesses 97 and 98 of the mounting extension ends 94 and 95, respectively, when the retainer member 110 is positioned in the groove 88. Thus, substantially the same releasable fastener arrangement is provided by the retainer member 110 as provided in the fastener assembly 100 described for retainer member 26. It is to be understood that the description herein of the use of the retainer member 26 is equally applicable to the retainer member 110 and to the further alternate retainer member 118 described hereinafter.

Figure 8:
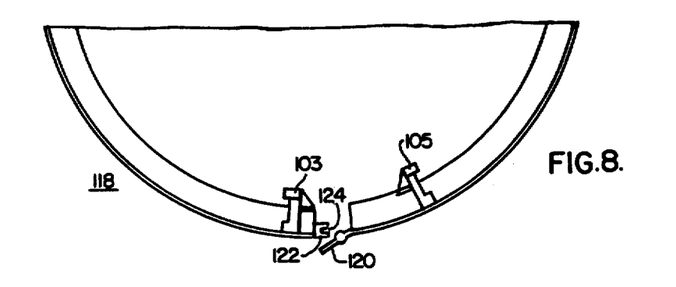
FIG. 8 is a fragmental rear elevational view of an alternative form of the retainer member shown in FIG. 6.

A fragmentary view of still another alternate retainer member 118 is shown in FIG. 8 which is substantially identical to the retainer member 26 and including the parts 103 and 105 but additionally including a further releasable fastener feature having a tab 120 extending from one end of the member 118 and further including a locking projection 122 having a circumferentially disposed slot 124 receiving the tab 120. After the retainer member 118 is mounted to the mounting extension 24, as described above for the member 26, the ends of the retainer member 118 are interconnected by inserting tab 120 into slot 124. Thus, the member 118 is more rigidly mounted to the extension 24 since the ends of the member 118 are prevented from being circumferentially contracted or expanded.

The unique adaptive socket attachment assembly 22 of this invention is shown in the alternate modes of use for detachably mounting the equipment enclosure unit 16 to a standard ringless type socket as shown in FIG. 5 or to a standard ring type socket as shown in FIG. 11. When the detachable watthour meter 18 is attached to the enclosure unit 16 with the blade extensions 68 assembled thereto, as shown in FIG. 1, the retainer member 26 and its cooperative relationship with the mounting extension 24 permits the adaptive socket attachment assembly 22 to be equally usable for attachment to either of the ring or ringless types of meter sockets. For example, the attachment to the ringless meter socket 40 shown in FIG. 5 requires that a box enclosure 130 thereof have the front cover 132 thereof moved to an open position for receiving a meter or the enclosure unit 16. The rear end of the mounting extension 24 without the retainer member 26 is inserted through the front of the meter opening 134 of the enclosure cover 132. The retainer member 26 is then sprung outward and slipped over the extension 24 and thereafter snaps into the groove 88 due to the resiliency of the member 26. The ends of the retainer member 26 are interlocked with the ends 94 and 95 of the opening 93 in the mounting extension 24 by the members 103 and 105 being manually positioned into the notches 97 and 98. The socket enclosure cover 132 along with the rear end of the enclosure unit 16 is returned to the closed position of the socket 40 so that the ends 76 of the blade terminal extensions 68 are received by the socket jaw terminals 44, as shown in FIG. 5. The enclosure cover 132 is locked to the front of the enclosure 130 in a conventional manner to provide a final attachment step. As shown in FIG. 5, the edge of the opening 134 of the closed enclosure cover 132 rearwardly overlaps the radial portion 91 of the retainer member 26 to prevent withdrawal of the enclosure unit 16 from the socket 40. Thus, the equipment enclosure unit 16 is mounted to the ringless type of meter socket 40 in accordance with the standard detachable meter mounting arrangement thereof.

Detachable mounting of the enclosure unit 16 is shown in FIG. 11 as it is attached to a standard ring type meter socket 136. The ring socket 136 has a circular mounting rim 138 at the circular opening thereof. The ring socket 136 is only partially shown in FIG. 11 for purposes of showing the standard detachable meter mounting relationship with the adaptive socket attachment assembly 22 of the enclosure unit 16. It is understood that the ring type socket 136 is made in accordance with the standard specifications noted hereinabove and it is further understood that the socket 136 includes a terminal block with associated jaw terminals as provided by the terminal block 42 with the jaw terminals 44 shown in FIG. 5 in the meter socket 40. The retainer member 26 is first mounted to the groove 88 of the mounting extension 24 prior to being inserted into the socket 136. The retainer member 26 is held in place by the interlocking parts described for the releasable retainer fastener assembly 100. The terminal end 76 of the terminal extensions 68 are inserted into the associated jaw terminals, not shown, of the ring type socket 136. The back of the mounting extension 24 at the blade support areas 80 abuts the mounting rim 138 of the socket 136 with the retainer member 26 extending radially outward thereof as further shown in FIG. 11. A further sealing ring 140, which may be the same as described for the sealing ring 19, is mounted over both the socket mounting rim 138 and the retainer member 26 with the ends thereof being locked together in a known manner so that the enclosure unit 16 is attached thereto also in accordance with the standard detachable meter mounting arrangement thereof.

A grounding arrangement is further included in the enclosure unit 16 as shown in FIGS. 2 and 3. In the front view of FIG. 2 a pair of conductive grounding terminals 142 and 144 extend over the front of the mounting rim 66 and extend therefrom rearwardly inside of the circular surfaces formed by the front rim 66. Suitable fasteners 146 such as screws or rivets secure the grounding terminals 142 and 144 in place as shown in FIG. 2. The rear of the enclosure unit 16 as shown in FIG. 3 includes a second pair of grounding terminals 148 and 150 on the back of the mounting extension 24 below the upper two of the blade support areas 80. The terminals 148 and 150 are held in place by further ones of the fasteners 146. The grounding terminals 148 and 150 have a resilient tab configuration and are located at the same location as are grounding straps or contacts for watthour meter surge gaps, not shown, provided in accordance with the aforementioned standards for detachable watthour meter bases such as base 32. A pair of conductive members, such as formed by a pair of insulated wire conductors, have opposite ends thereof connected to separate pairs of the fasteners 146 to interconnect the terminals 142 and 144 with the terminals 150 and 148, respectively. Thus, when the detachable watthour meter 18 is mounted on the front rim 66 of the enclosure unit 16, the mounting base grounding straps of the meter 18 are electrically connected to the grounding terminals 142 and 144 and through the interconnecting members to the rear grounding terminals 148 and 150. When the enclosure unit 16 is mounted to a standard meter socket, the conventional manner of making meter grounding contact therewith is provided by the rear grounding terminals 148 and 150.

A summary of one preferred use of the auxiliary equipment enclosure unit 16 is made beginning with the body parts 45 and 46 of the enclosure unit 16 being taken as separated. The auxiliary equipment such as may include but not limited to the circuit board cards 54, 55, 56, and 57 are inserted into the open top of the lower body part 46 and into the slotted card guide 60 as shown in FIG. 4. The upper body part 45 is aligned over the lower part 46 and the two parts are secured together to clamp the parts together and form an integral body and clamp aforementioned cards therebetween by applying the fasteners 52 to the rear and front tabs 49 and 50. The cards 54, 55, 56, and 57 are then confined and protected within the housing 24. Thereafter, a detachable watthour meter 18, with the blade terminal extensions 68 rigidly clamped to the meter blades 36, is inserted into the front end of the enclosure unit 16. The blade terminal extensions 68 are inserted through the slots 82 of the blade support areas 80 so that the rear terminal ends 76 of the extensions 68 are maintained in alignment for insertion into the jaw terminals of a meter socket. The retainer member 26 is mounted on the mounting extension 24 either after the front cover 132 of the ringless socket 40 is received over the mounting extension 24 or prior to insertion into the ring type socket 136. After mounting to the jaw terminals of a socket terminal arrangement the enclosure unit 16 is secured to a ringless socket by locking the enclosure cover 132 in place or by mounting a sealing ring 140 at the ring type meter socket 136. Connections, not shown, are made between terminal lead conductors extending from the rear of the meter 18 and the electrical devices carried in the housing 20 and between the unit devices and further electrical devices external to the enclosure unit 16 such as are associated with the power line conductors connected to the meter socket terminals in a manner not forming part of the present invention.

While preferred embodiments of the present invention are described hereinabove, it is contemplated that obvious modifications and variations may be made by those skilled in the art without departing from the spirit and scope of this invention.

We claim:

1. An auxiliary equipment enclosure unit mountable both at a ring-type watthour meter socket having a sealing ring and at a ringless-type watthour meter socket having an enclosure cover, said enclosure unit comprising:
   a hollow body defining a housing portion adapted to receive separate equipment devices therein; and an adaptive socket attachment assembly including a mounting extension extending axially from the rear end of said housing portion and having an outer periphery circumscribing an area less than the vertical cross sectional area of said housing portion with said mounting extension including a circumferential groove, said adaptive socket attachment assembly further including a resiliently expandable and removable retainer means resiliently positionable in said circumferential groove so as to be axially confined therein, said enclosure unit, when mounted to a ring-type watthour meter socket, being mounted in an abutting relationship to said ring-type watthour meter socket, with said retainer means being maintained in a predetermined radially overlapping relationship with the sealing ring of said ring-type watthour meter socket such that said sealing ring retains said enclosure unit at said ring-type meter socket, said enclosure unit, when mounted at a ringless-type meter socket having both said mounting extension and said retainer member inserted in said ringless-type watthour meter socket such that the enclosure cover thereof retains said enclosure unit at said ringless-type meter socket.

2. The auxiliary equipment enclosure unit as claimed in claim 1 wherein said retainer means includes a substantially circular split ring.

3. The auxiliary equipment enclosure unit as claimed in claim 2 wherein said retainer means includes a releasable fastener assembly interconnecting the split ring ends.

4. The auxiliary equipment enclosure unit as claimed in claim 2 wherein said retainer means includes a releasable fastener assembly attaching the split ring ends to said mounting extension so that the split ring retainer means is biased in a slightly contracted condition within the circumferential groove.

5. The auxiliary equipment enclosure unit as claimed in claim 2 wherein said retainer means has an L-shaped cross section defining radial part receivable by said recessed portion and an axial part defining a rim having a predetermined diameter.

6. The auxiliary equipment enclosure unit as claimed in claim 5 wherein said retainer means is made of a molded plastic material.

7. The auxiliary equipment enclosure unit as claimed in claim 5 wherein said retainer means is made of a sheet metal material.

8. The auxiliary equipment enclosure unit as claimed in claim 1 wherein said outer periphery of said mounting extension includes an opening therein.

9. The auxiliary equipment enclosure unit as claimed in claim 8 wherein the circumferential groove extends radially into the outer periphery of said mounting extension and between the spaced ends of said opening in said mounting extension.

10. The auxiliary equipment enclosure unit as claimed in claim 9 wherein said outer periphery of said mounting extension is a substantially straight cylindrical surface interrupted by said side opening being at the bottom thereof.

11. The auxiliary equipment enclosure as claimed in claim 5 wherein said outer periphery of said mounting extension has a cylindrical surface with a side opening and wherein the circumferential groove extends between the ends of said side opening of said outer periphery and further wherein the split ring retainer means includes a releasable fastener assembly for interlocking the split ring ends with the ends of said side opening of said outer periphery.

12. The auxiliary equipment enclosure unit as claimed in claim 11 wherein said releasable fastener assembly further connects the split ring ends of said retainer means with each other so as to prevent contraction and expansion of the split ring ends.

13. The auxiliary equipment enclosure unit as claimed in claim 1 wherein said body is formed by two body parts joined along a substantially center horizontal plane thereof.

14. The auxiliary equipment enclosure unit as claimed in claim 13 wherein the interior of said housing portion includes integral slotted mounting members for receiving and supporting circuit board cards.

15. The auxiliary equipment enclosure unit as claimed in claim 13 wherein said two body parts are made of a molded plastic material.

16. The auxiliary equipment enclosure unit as claimed in claim 15 wherein said molded plastic material is a glass filled polyester.

17. The auxiliary equipment enclosure unit as claimed in claim 1 wherein said hollow body includes a front end integral with said housing portion and having meter attachment means for detachably receiving a detachable watthour meter; and further including plural blade terminal extensions each having a flat conductive bar extending through said housing portion and from the rear end of the housing portion for a predetermined length, each of said extensions further having a rear contact end for insertion into a jaw terminal and a forward bifurcated end having flat parallel sides spaced for receiving a separate one of the blade terminals of a watthour meter receivable by said meter attachment means; and still further having plural rigid clamping members for permanently clamping each of the meter blade terminals between the flat bifurcated ends of each of said plural blade terminal extensions.

18. The auxiliary equipment enclosure as claimed in claim 17 wherein the housing portion rear end includes blade support areas including slot openings each receiving one of said plural blade terminal extensions.

19. The auxiliary equipment enclosure as claimed in claim 17 wherein each of said plural blade terminal extensions includes a further conductive bar having substantially the same width as the first named conductive bar, being shorter in length and further being attached in parallel overlapping relationship with said first named bar so that two bars define opposite sides of the bifurcated forward end.

20. The auxiliary equipment enclosure as claimed in claim 19 wherein each of said plural clamping members includes a screw fastener extending through said bifurcated forward end and having a head disposed on one side of the forward end and receiving an internally threaded member on the other side of the forward end for rigidly clamping a meter blade terminal received therein.

21. An auxiliary equipment enclosure unit for interposed mounting between a watthour meter socket and a detachable watthour meter having rear blade terminals, said enclosure unit being mountable with both ring-type sockets having a sealing ring and ringless-type sockets having an enclosure cover, said enclosure unit comprising:

a body including a central housing portion having a front end for attachment to the detachable watthour meter and a rear end, the interior of said housing portion adapted to receive and enclose auxiliary equipment devices therein;

an adaptive socket attachment assembly including a mounting extension extending from a vertical back wall surface of said housing portion, said mounting extension including an annular groove around the circumference of said mounting extension, said adaptive socket attachment assembly further including a retainer means having a split ring configuration and receivable by said annular groove of said mounting extension in a resilient snap on fashion and extending radially outward therefrom to define a rim surface having a predetermined diameter, upon said enclosure unit being mounted at a ring-type meter socket said mounting extension is in an abutting relationship with said ring-type meter socket and said retainer means is in a predetermined radially overlapping relationship with the sealing ring of said ring-type meter socket such that said ring retains said enclosure unit at said ring-type meter socket, upon said enclosure unit being mounted at a ringless-type meter socket both said mounting extension and said retainer means are inserted therein such that said enclosure cover retains said enclosure unit at said ringless-type meter socket;

a plurality of blade terminal extensions including straight conductive bar members with bifurcated forward ends for receiving each of the meter blade terminals within flat overlapping contact areas along both sides thereof;

and a plurality of threaded clamping members each fixedly attaching the bifurcated forward ends of the blade extensions to the meter blade terminals received therein.

22. The auxiliary equipment enclosure unit as claimed in claim 21 wherein said retainer means includes a releasable fastener assembly for interlocking the ends of the split ring retainer means with said mounting extension.

23. The auxiliary equipment enclosure unit as claimed in claim 22 wherein said mounting extension includes a pair of circumferentially spaced notched parts defining spaced ends of the annular groove therein and wherein said retainer means includes a pair of latching parts extending radially inward adjacent the split ring ends so that when said retainer means is resiliently positioned said latching parts are positionable in interlocking relationship with the notched end parts of said mounting extension.

24. The auxiliary equipment enclosure unit as claimed in claim 22 wherein said releasable fastener assembly means further connects the end of the split ring configuration together.

25. The auxiliary equipment enclosure unit as claimed in claim 24 wherein the releasable fastener assembly includes a tab extending from one split ring end and a slotted projection extending from the other split ring end for receiving said tab.

26. The auxiliary equipment enclosure unit as claimed in claim 21 wherein said body is made of two molded body parts defining upper and lower parts thereof with said two parts being attached by removable fastener means when assembled together.

27. The auxiliary equipment enclosure unit as claimed in claim 26 wherein said housing portion includes a hollow interior with both of the two body parts having plural card mounting members integrally molded therewith for supporting circuit board cards substantially parallel to said plurality of blade terminal extensions.

* * * * *